(12) United States Patent
Balteanu

(10) Patent No.: US 10,477,550 B2
(45) Date of Patent: Nov. 12, 2019

(54) FRONT-END MODULES FOR CARRIER AGGREGATION

(71) Applicant: SKYWORKS SOLUTIONS, INC., Woburn, MA (US)

(72) Inventor: Florinel G. Balteanu, Irvine, CA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 15/828,308

(22) Filed: Nov. 30, 2017

(65) Prior Publication Data

US 2018/0152945 A1 May 31, 2018

Related U.S. Application Data

(60) Provisional application No. 62/428,442, filed on Nov. 30, 2016.

(51) Int. Cl.
*H04L 5/14* (2006.01)
*H04W 72/04* (2009.01)
*H04L 5/00* (2006.01)

(52) U.S. Cl.
CPC ....... *H04W 72/0453* (2013.01); *H04L 5/0005* (2013.01); *H04L 5/14* (2013.01); *H04W 72/0406* (2013.01); *Y02D 70/00* (2018.01); *Y02D 70/10* (2018.01); *Y02D 70/1262* (2018.01); *Y02D 70/14* (2018.01); *Y02D 70/142* (2018.01); *Y02D 70/144* (2018.01); *Y02D 70/164* (2018.01)

(58) Field of Classification Search
CPC .... H04B 1/0475; H04B 1/0057; H04B 1/006; H04B 1/1036; H04B 2001/1063; H04L 27/0014; H04L 27/2647; H04L 5/14; H03G 3/3052
See application file for complete search history.

(56) References Cited

U.S. PATENT DOCUMENTS

| | | | |
|---|---|---|---|
| 2015/0018043 A1* | 1/2015 | Taniuchi | H03H 7/465 455/561 |
| 2016/0233895 A1* | 8/2016 | Khlat | H04B 1/0064 |
| 2016/0359506 A1* | 12/2016 | Ellae | H04B 1/0057 |
| 2018/0138927 A1* | 5/2018 | Nagumo | H04B 1/0057 |

* cited by examiner

*Primary Examiner* — Mohamed A Kamara
(74) *Attorney, Agent, or Firm* — Chang & Hale LLP

(57) ABSTRACT

Disclosed herein are front-end modules that support carrier aggregation. Wireless communication configurations are disclosed that include a plurality of such front-end modules to support uplink and/or downlink carrier aggregation. Individual front end modules include a power amplifier module to amplify signals received at a transceiver port and an envelope tracker to increase efficiency of the power amplifier module. The front-end modules include a multiplexer and an antenna switch module with a plurality of duplexers between them along a corresponding plurality of paths. One path includes a first duplexer configured to process frequency division duplex (FDD) signals and another path includes a second duplexer configured to process time division duplex (TDD) signals. The front-end modules also include a low noise amplifier module coupled to the second duplexer to amplify TDD signals while received FDD signals are directed off module for amplification.

20 Claims, 5 Drawing Sheets

FRONT-END MODULES FOR CARRIER AGGREGATION

CROSS-REFERENCE TO RELATED APPLICATIONS

This application claims priority to U.S. Provisional Application No. 62/428,442 filed Nov. 30, 2016 and entitled "FRONT-END MODULES FOR CARRIER AGGREGATION," which is expressly incorporated by reference herein in its entirety for all purposes.

BACKGROUND

Field

The present disclosure generally relates to front-end architectures for wireless applications.

Description of Related Art

Carrier aggregation (CA) is a data transmission strategy that transmits data across multiple frequency bands to increase data bandwidth, and thereby to increase the bitrate. Each aggregated carrier is referred to as a component carrier. In some scenarios, CA uses contiguous component carriers within the same operating frequency band. In other scenarios, the component carriers belong to the same operating frequency band, but have a gap, or gaps, in between. In yet other scenarios, component carriers belong to different operating frequency bands.

SUMMARY

According to a number of implementations, the present disclosure relates to a front-end module configured to support carrier aggregation. The front-end module includes a power amplifier module including one or more power amplifiers configured to amplify signals received at a transceiver port. The front-end module also includes an envelope tracker configured to modify a supply voltage to the power amplifier module to increase efficiency of the one or more power amplifiers. The front-end module also includes a multiplexer coupled to the power amplifier module, the multiplexer configured to direct received signals along a plurality of paths. The front-end module also includes a first duplexer coupled to the multiplexer, the first duplexer configured to process signals that utilize a frequency division duplex scheme. The front-end module also includes a second duplexer coupled to the multiplexer, the second duplexer configured to process signals that utilize a time division duplex scheme. The front-end module also includes an antenna switch module coupled to the first duplexer and to the second duplexer, the antenna switch module configured to direct signals between an antenna port and the first duplexer or the second duplexer. The front-end module also includes a low noise amplifier module including one or more low noise amplifiers configured to amplify signals received at the antenna port, the low noise amplifier module coupled to the second duplexer to amplify signals that utilize the time division duplex scheme.

In some embodiments, the envelope tracker is implemented as part of the power amplifier module. In some embodiments, the front-end module also includes a bypass switch that provides a bypass path from the transceiver port to the multiplexer to bypass the one or more power amplifiers of the power amplifier module. In some embodiments, the first duplexer is configured to direct signals received at the antenna port to a FDD output port that is different from the transceiver port.

In some embodiments, the first duplexer is configured to receive signals in the cellular frequency band B7 and the second duplexer is configured to receive signals in the cellular frequency band B41. In further embodiments, the front-end module also includes a third duplexer configured to receive signals in the cellular frequency band B38. In further embodiments, the front-end module also includes a fourth duplexer configured to receive signals in the cellular frequency band B40. In further embodiments, the front-end module also includes a first TDD switch configured to receive signals from the second duplexer and the third duplexer and to direct selected signals to a first low noise amplifier of the low noise amplifier module. In further embodiments, the front-end module also includes a second TDD switch configured to receive signals from the fourth duplexer and to selectively direct the received signals to a second low noise amplifier of the low noise amplifier module.

In some embodiments, the front-end module also includes a notch filter coupled to the second duplexer, the notch filter configured to extract signals that correspond to a wireless local area network signal. In some embodiments, the antenna switch module includes a single pole, multiple throw (SPMT) switch wherein the pole is coupled to the antenna port and a first throw is coupled to a first filter of the first duplexer, a second throw is coupled to a second filter of the first duplexer, and a third throw is coupled to the second duplexer. In some embodiments, the front-end module is implemented on a packaging substrate configured to receive a plurality of components.

According to a number of implementations, described herein is a wireless communication configuration configured to support carrier aggregation. The wireless communication configuration includes an antenna configured to receive wireless signals within a plurality of cellular frequency bands and a multiplexer coupled to the antenna, the multiplexer including a first filter configured to pass signals within a first frequency range and a second filter configured to pass signals within a second frequency range different from the first frequency range. The wireless communication configuration also includes a first front-end module coupled to the first filter and a second front-end module coupled to the second filter. Each of the first front-end module and the second front-end module includes a power amplifier module includes one or more power amplifiers configured to amplify signals received at a transceiver port, each of the first front-end module and the second front-end module also includes an envelope tracker configured to modify a supply voltage to the power amplifier module to increase efficiency of the one or more power amplifiers, each of the first front-end module and the second front-end module also includes a multiplexer coupled to the power amplifier module, the multiplexer configured to direct received signals along a plurality of paths, each of the first front-end module and the second front-end module also includes a first duplexer coupled to the multiplexer, the first duplexer configured to process signals using a frequency division duplex scheme, each of the first front-end module and the second front-end module also includes a second duplexer coupled to the multiplexer, the second duplexer configured to process signals using a time division duplex scheme, each of the first front-end module and the second front-end module also includes an antenna switch module coupled to the first duplexer and to the second duplexer, the antenna switch module configured to direct signals between an antenna port and the first duplexer or the second duplexer, and each of the first front-end module and the second front-end module also includes a low noise amplifier module includes one or more low noise amplifiers configured to amplify signals received at the antenna port, the low noise amplifier module coupled to the second duplexer to amplify signals using the time division duplex scheme.

In some embodiments, the wireless communication also includes an off-module low noise amplifier apart from the first front-end module and from the second front-end module, the off-module low noise amplifier configured to amplify signals received from the first front-end module. In some embodiments, to perform downlink carrier aggregation, the first front-end module is configured to process signals for transmission and to process high-band cellular signals directed to the first front-end module from the first filter; and the second front-end module is configured to process low-band cellular signals directed to the second front-end module from the second filter.

In some embodiments, to perform uplink carrier aggregation, the first front-end module is configured to process high-band cellular signals for transmission and to process high-band cellular signals directed to the first front-end module from the first filter; and the second front-end module is configured to process low-band cellular signals for transmission and to process low-band cellular signals directed to the second front-end module from the second filter.

In some embodiments, the multiplexer comprises a diplexer configured to separate low-band and high-band cellular signals. In some embodiments, the multiplexer comprises a triplexer configured to separate low-band, mid-band, and high-band cellular signals. In further embodiments, the wireless communication also includes a third front-end module coupled to a bandpass filter of the triplexer.

In some embodiments, the first front-end module is implemented on a first packaging substrate and the second front-end module is implemented on a second packaging substrate.

For purposes of summarizing the disclosure, certain aspects, advantages and novel features have been described herein. It is to be understood that not necessarily all such advantages may be achieved in accordance with any particular embodiment. Thus, the disclosed embodiments may be carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Overview

Uplink carrier aggregation (UL CA) combines two or more wireless (e.g., LTE) signals (component carriers), transmitted (uplinked) from a single user device to a wireless base station, dramatically increasing the speed with which a user can upload content and files. Similarly, downlink carrier aggregation (DL CA) combines two or more wireless (e.g., LTE) signals (component carriers), received (downlinked) by a single user device from a wireless base station, dramatically increasing the speed with which a user can download content and files. In the user device, front-end modules and architectures can be provided that support UL CA and/or DL CA.

Disclosed herein are, among others, examples related to front-end module designs that support CA, including considerations for: front-end module integration; power, gain, noise, and/or linearity budget for CA front-end modules; envelope tracking for CA; and passive integration including diplexers, duplexers, and/or filters. In particular, the front-end modules disclosed herein provide advantages in CA based at least in part on the combination of features provided by the modules. For example, the disclosed front-end modules include power amplifiers (PAs) for signals to be transmitted, low noise amplifiers (LNAs) for received signals, antenna switch modules, multiplexers (e.g., diplexers, triplexers, etc.), duplexers, and envelope tracking.

Particular advantages can be realized using the disclosed front-end modules. For example, some embodiments of the disclosed front-end modules include envelope tracking as part of the module. In some embodiments, envelope tracking may be included in a PA module to increase efficiency and/or to improve performance of the amplification path for signals to be transmitted. As another example, some embodiments of the disclosed front-end modules include band-specific filters and/or duplexers to process frequency division duplex (FDD) cellular frequency bands and time division duplex (TDD) frequency cellular bands. In certain implementations, a notch filter can be included on the front-end module to extract wireless local area network (WLAN) signals from the cellular frequency bands (e.g., from cellular band B40). As another example, some embodiments of the disclosed front-end modules include a bypass switch to provide a bypass path for transmission signals to bypass the PA module. As another example, some embodiments of the disclosed front-end modules include LNAs on the module to amplify received signals in a plurality of TDD cellular frequency bands. As another example, some embodiments of the disclosed front-end modules direct received signals in one or more FDD cellular frequency bands to a separate module for amplification to reduce degradation of signal quality on the front-end module.

Example Front-End Modules

Figure 1A:
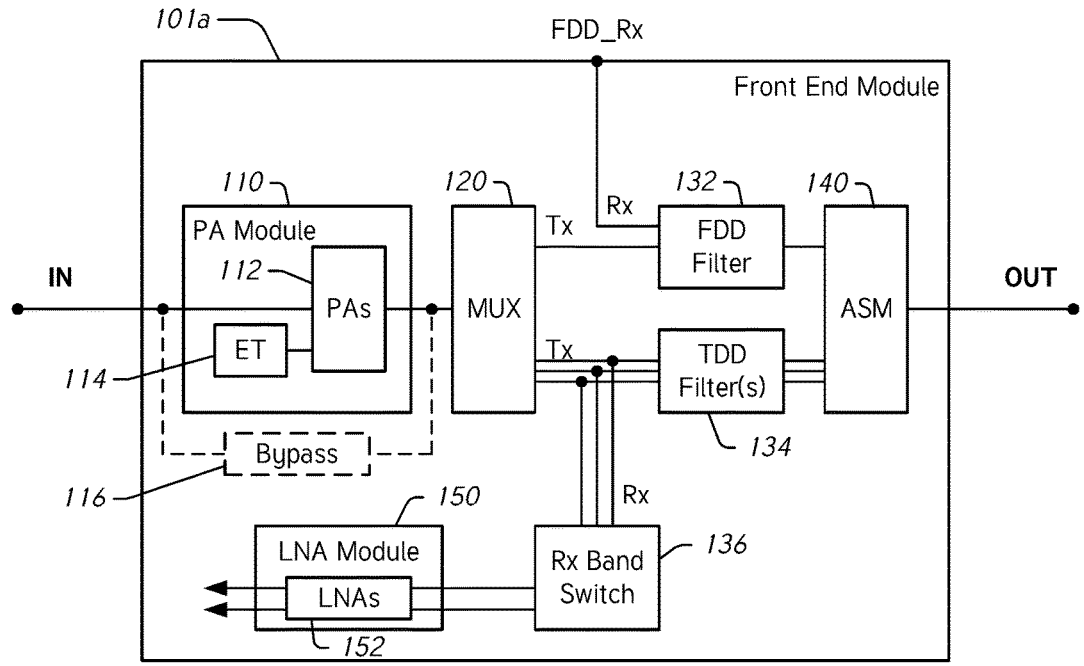
FIGS. 1A and 1B illustrate example front-end modules that support carrier aggregation.
Figure 1B:
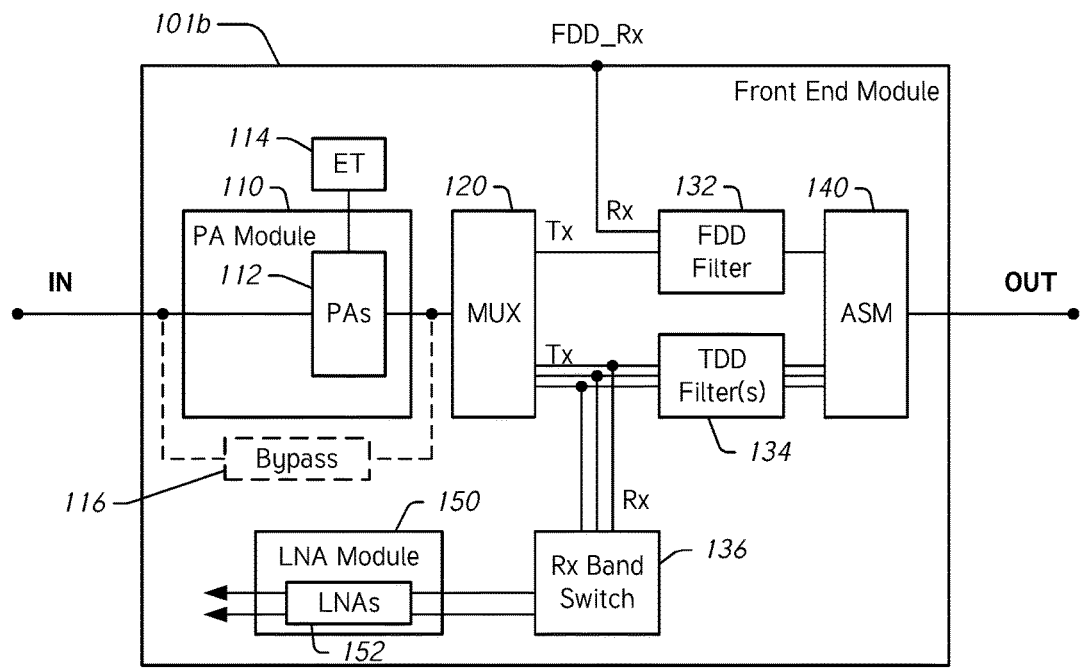

FIGS. 1A and 1B illustrate example front-end modules 101*a*, 101*b* that support carrier aggregation. The front-end module 101*a* of FIG. 1A includes a power amplifier module 110 including one or more power amplifiers (PAs) 112 configured to amplify signals received at a transceiver port (IN). The front-end module 101*a* includes an envelope tracker 114 configured to modify a supply voltage to the power amplifiers 112 to increase efficiency of the one or more power amplifiers 112. In the front-end module 101*a*, the envelope tracker 114 is implemented as part of the power amplifier module 110. In the front-end module 101*b* of FIG. 1B, the envelope tracker 114 is implemented outside of the power amplifier module 110.

The front-end module 101*a* includes a multiplexer 120 coupled to the power amplifier module 110. The multiplexer 120 is configured to direct signals along a plurality of paths. The multiplexer 120 can be implemented as a switch and can include one or more poles and/or throws. The multiplexer 120 can be configured to receive signals from the power amplifier module 110 and to direct those received signals along a plurality of paths to targeted filters and/or duplexers for further processing.

The front-end module 101*a* includes an antenna switch module (ASM) 140 coupled to an antenna port (OUT) and is configured to couple to at least a subset of the plurality of paths of the multiplexer 120. The ASM can be a single pole multiple throw (SPMT) switch with individual throws coupled to individual filters and/or individual duplexers. The ASM 140 is configured to direct transmission signals to the antenna port for transmission over an antenna. Similarly, the ASM 140 is configured to direct received signals from the antenna port to targeted duplexers and/or filters.

The front-end module 101*a* includes one or more frequency division duplex (FDD) filters 132 to filter FDD signals in one or more FDD cellular frequency bands. The FDD filter 132 is coupled to the multiplexer 120 to receive FDD signals for transmission. The FDD filter 132 can include a first duplexer configured to process signals that utilize a frequency division duplex scheme. The FDD filter 132 is coupled to the ASM 140 to direct received FDD signals to an FDD output port (FDD_Rx). These signals can be directed to a low noise amplifier on another module, different from the front-end module 101*a*.

The front-end module 101*a* includes one or more time division duplex (TDD) filters 134 to filter TDD signals in one or more TDD cellular frequency bands. The TDD filters 134 are coupled to the ASM 140 to direct received TDD signals to low noise amplifiers for amplification. The TDD filters 134 are also coupled to the multiplexer 120 to receive TDD signals for transmission. The TDD filters 134 can include a second duplexer configured to process signals that utilize a time division duplex scheme.

Accordingly, the ASM 140 is configured to direct signals between an antenna port (OUT) and the FDD filter 132 and/or the TDD filter(s) 134. Although three lines are shown from the ASM 140 to the TDD filter 134 and a single line is shown from the ASM 140 to the FDD filter 132, it is to be understood that one or more signals or cellular frequency bands may be directed between the ASM 140 and the FDD filter 132 as well as one or more signals or cellular frequency bands may be directed between the ASM 140 and the TDD filter(s) 134. It is also to be understood that the front-end module 101*a* includes impedance matching components, filters, phase shifting components, and the like to reduce signal degradation through the module.

The front-end module 101*a* also includes a low noise amplifier module 150 that includes one or more low noise amplifiers 152 configured to amplify signals received at the antenna port (OUT). The low noise amplifier module 152 is coupled to the TDD filter(s) 134 to amplify signals that utilize the time division duplex scheme. The front-end module 101*a* also includes an Rx band switch 136 coupled to the TDD filter(s) 134 and to the LNA module 150. The Rx band switch 136 is configured to receive a plurality of receive (Rx) TDD signals from the TDD filter(s) 134 and to selectively direct the received signals to targeted LNAs 152. The Rx band switch 136 can include single pole single throw switches to selectively couple an Rx path from a particular TDD filter 134 to a particular LNA 152. Similarly, the Rx band switch 136 can include single pole multiple throw switches to alternately switch between coupling a first Rx path from a first TDD filter 134 to a targeted LNA and a second Rx path from a second TDD filter 134 to the targeted LNA. In this way, the Rx band switch 136 enables a single LNA 152 to amplify signals from a plurality of different cellular frequency bands.

In some embodiments, the front-end module 101*a* includes a bypass switch 116 that provides a bypass path from the transceiver port (IN) to the multiplexer 120 to bypass the one or more power amplifiers 112 of the power amplifier module 110. It is to be understood that although not shown, the front-end module 101*a* includes a controller configured to control switching and routing of the bypass switch 116, the multiplexer 120, the ASM 140, and/or the Rx band switch 136.

FIG. 1B illustrates a front-end module 101*b* that is similar to the front-end module 101*a* except that the envelope tracker 114 is implemented outside of the power module 110.

Each of the front-end modules 101*a*, 101*b* can be implemented as a module that includes a packaging substrate with a number of components mounted on such a packaging substrate. For example, a controller (which may include a front-end power management integrated circuit [FE-PMIC]), the PA module 110, the LNA module 150, the multiplexer 120, the FDD filters 132, the TDD filters 134, the Rx band switches 136, and the antenna switch module 140 can be mounted and/or implemented on and/or within the packaging substrate. Other components, such as a number of SMT devices, can also be mounted on the packaging substrate.

Figure 2:
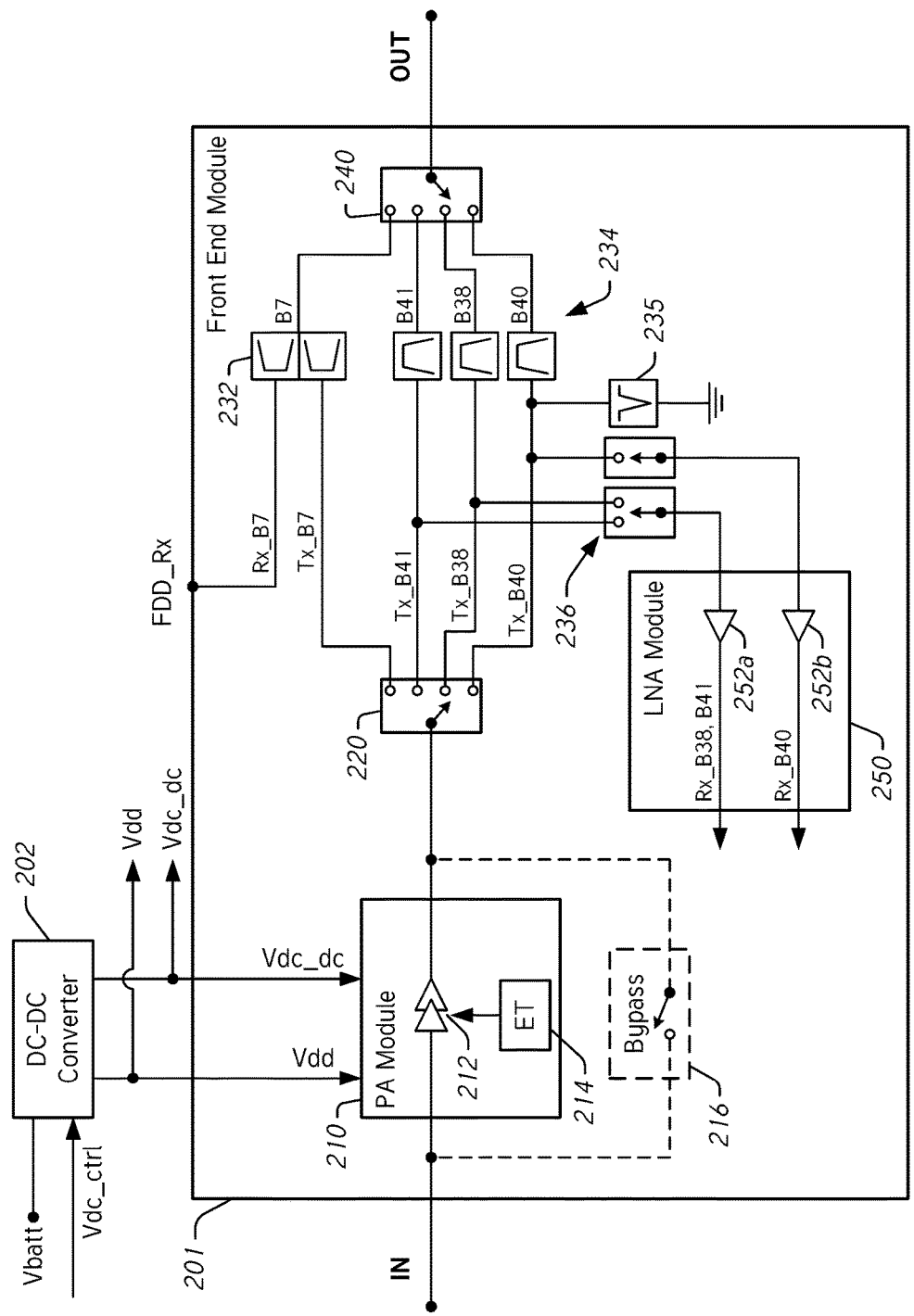
FIG. 2 illustrates an example embodiment of the front-end module of FIG. 1A.

FIG. 2 illustrates an example embodiment of the front-end module of FIG. 1A. The front-end module 201 is similar to the front-end module 101*a* described herein with reference to FIG. 1A so a full description of common components between the modules will not be provided. The front-end module 201 includes a PA module 210 with PAs 212 and an envelope tracker 214. The front-end module 201 includes a bypass switch 216 that selectively couples a transceiver port (IN) to a multiplexer 220 to bypass the PA module 210. The PA module receives a supply voltage (Vdd) and a DC voltage (Vdc_dc) to power the PAs 212. The envelope tracker 214 is configured to modify voltages provided to power the PAs 212 to increase efficiency of the PAs 212. The envelope tracker can also receive an envelope signal (not shown). The supply voltage and the DC voltage are provided by a DC-DC converter 202 (which may include a power management integrated circuit or PMIC). The DC-DC converter 202 receives a battery voltage (Vbatt) and a DC control signal (Vdc_ctrl) to provide a targeted supply voltage (Vdd) and DC voltage (Vdc_dc) to the front-end module 201. These voltages may also be provided to additional front-end modules, examples of which are described herein with reference to FIGS. 3 and 5.

The multiplexer 220 of the front-end module 201 is implemented as a single pole multiple throw (SPMT) switch wherein the pole couples to the output of the PA module 210 and the multiple throws couple to a plurality of paths that are also coupled to an antenna switch module (ASM) 240. The ASM 240 is implemented as a single pole multiple throw (SPMT) switch wherein the pole couples to an antenna port (OUT) and the multiple throws couple to at least a subset of the plurality of paths from the multiplexer 220. The ASM 240 is coupled to a first duplexer 232 that is configured to process FDD signals to provide a transmission signal and a receive signal. The receive signal is directed to an FDD output port (FDD_Rx). The transmission signal is coupled to the multiplexer 220. Similarly, the ASM is coupled to a plurality of TDD filters 234 that are positioned between the multiplexer 220 and the ASM 240 on a subset of the plurality of paths. The TDD filters 234 are coupled to Rx band switches 236 that are configured to selectively direct TDD receive (Rx) signals to LNAs 252a, 252b of an LNA module 252.

By way of example, the FDD cellular frequency band B7 is used as well as the TDD cellular frequency bands B38, B40, and B41. Band B7 is directed through the filter 232 so that transmission signals pass to the ASM 240 for transmission and receive signals pass from the ASM 240 to the FDD output port (FDD_Rx) to be amplified by a low noise amplifier on another module.

Band B41 is coupled to a first filter of the TDD filters 234 between the ASM 240 and the multiplexer 220 so that a transmission signal is directed from the PA module 210, through the first filter of the TDD filters 234 and to the antenna port. In addition, Band B41 is coupled to a single pole double throw (SPDT) switch of the Rx band switches 236 to selectively couple a receive path to a first LNA 252a.

Band B38 is coupled to a second filter of the TDD filters 234 between the ASM 240 and the multiplexer 220 so that a transmission signal is directed from the PA module 210, through the second filter of the TDD filters 234 and to the antenna port. In addition, Band B38 is coupled to the same SPDT switch as band B41 to selectively couple a receive path to the first LNA 252a. Accordingly, the first LNA 252a is configured to amplify receive signals from both band B38 and band B41.

Band B40 is coupled to a third filter of the TDD filters 234 between the ASM 240 and the multiplexer 220 so that a transmission signal is directed from the PA module 210, through the third filter of the TDD filters 234 and to the antenna port. In addition, Band B40 is coupled to a single pole single throw (SPST) switch of the Rx band switches 236 to selectively couple a receive path to a second LNA 252b. In addition, the front-end module 201 includes a notch filter 235 coupled to the third filter of the TDD filters 234. The notch filter is configured to extract wireless local area network (WLAN) signals from the cellular signals of band B40.

Example Wireless Communication Configurations and Considerations

Figure 3:
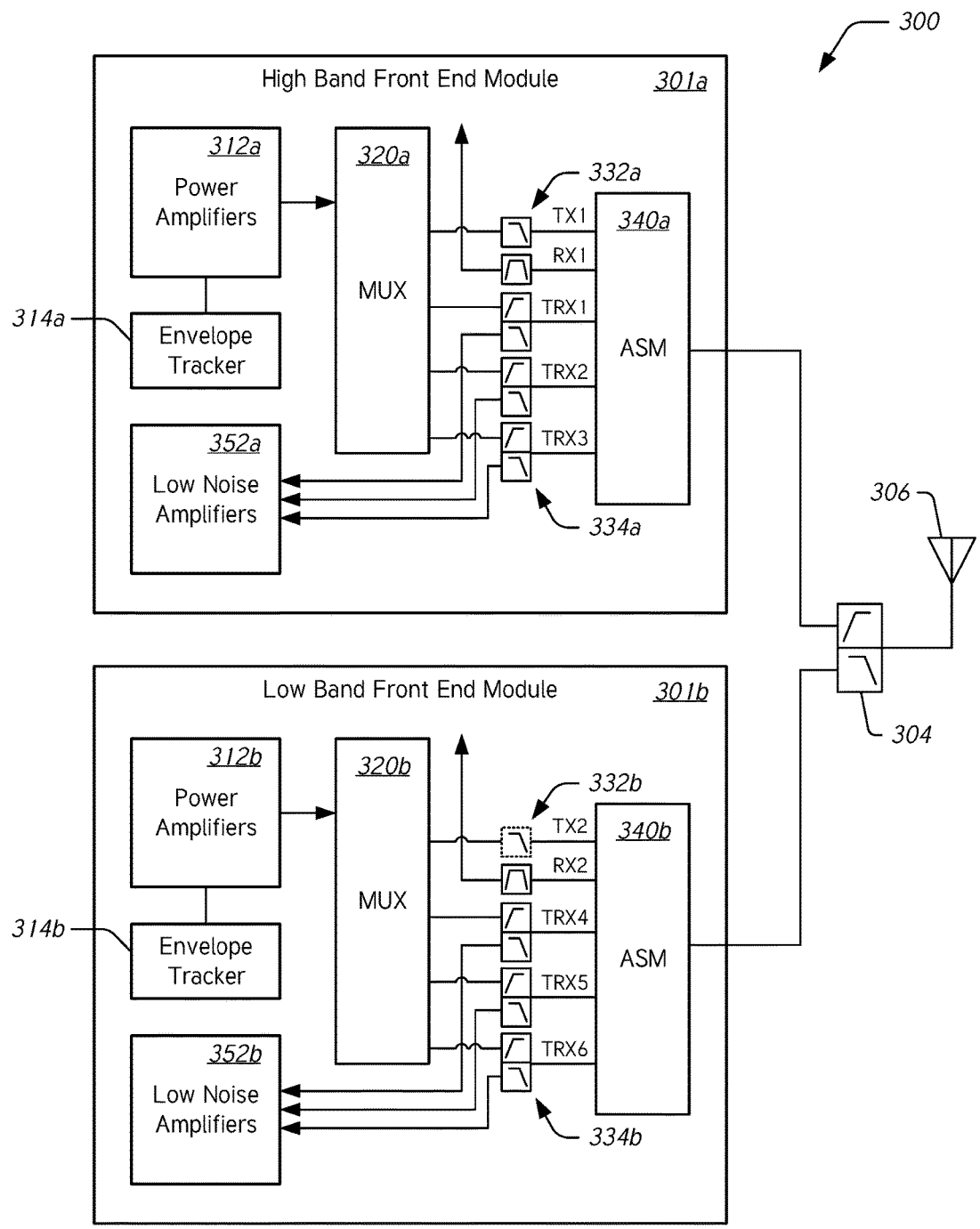
FIG. 3 illustrates a wireless communication configuration for uplink and/or downlink carrier aggregation using front-end modules for particular ranges of cellular frequency bands.

FIG. 3 illustrates a wireless communication configuration 300 for uplink and/or downlink carrier aggregation using front-end modules 301a, 301b for particular ranges of cellular frequency bands. The wireless communication configuration 300 includes an antenna 306 configured to receive wireless signals within a plurality of cellular frequency bands.

The wireless communication configuration 300 includes a multiplexer 304 coupled to the antenna, the multiplexer 304 including a first filter configured to pass signals within a first frequency range and a second filter configured to pass signals within a second frequency range different from the first frequency range. The multiplexer 304 is illustrated as a diplexer, but it is to be understood that the multiplexer 304 can be a triplexer or any other suitable combination of low-pass filters, high-pass filters, and/or bandpass filters. In the illustrated embodiment, the high-pass filter couples high-band signals between the antenna 306 and a high band (HB) front end module 301a and the low-pass filter couples low-band signals between the antenna 306 and a low-band (LB) front end module 301b. The multiplexer 304 can include a low-pass filter that passes low-band cellular frequencies to the LB front-end module 301b and a high-pass or band-pass filter that passes mid-band and high-band cellular signals as well as WLAN signals to the HB front-end module 301a. The multiplexer 304 can include a high-pass filter that passes ultrahigh-band (UHB) cellular signals and/or higher frequency WLAN signals to another multiplexer or module (not shown).

The multiplexer 304 can be configured to pass first signals having a frequency above a first threshold along a first path and to pass second signals having a frequency below a second threshold along a second path. In some embodiments, the first threshold is greater than or equal to the second threshold. The first signals can include cellular signals (e.g., mid- and/or high-band cellular frequencies) mixed with WLAN signals and the second signals can include cellular signals (e.g., low-band cellular frequencies). In some embodiments, the first signals include cellular signals (e.g., mid- and/or high-band cellular frequencies) with or without WLAN signals and the second signals include cellular signals (e.g., low-band cellular frequencies). As an example, the multiplexer 304 can have a variety of different configurations such as a diplexer that provides the functionality of a high pass filter and a low pass filter. In certain implementations, the multiplexer 304 comprises a multi-layer ceramic device, such as a low-temperature co-fired ceramic.

Each of the HB front-end module 301a and the LB front-end module 301b are similar to the front-end modules 101a, 101b, 201 described herein with respect to FIGS. 1A, 1B, and 2, respectively. Accordingly, a full description of similar components will not be provided again. In one or both of the front end modules 301a, 301b, the antenna switch module 340a, 340b includes a single pole, multiple throw (SPMT) switch wherein the pole is coupled to an antenna port and a first throw is coupled to a first filter (e.g., TX1 in front-end module 301a or TX2 in front-end module 301b) of a first duplexer 332a or 332b, a second throw is coupled to a second filter (e.g., RX1 in front-end module 301a or RX2 in front-end module 301b) of the first duplexer 332a or 332b, and a third throw is coupled to the second duplexer (e.g., TRX1 in front-end module 301a or TRX4 in front-end module 301b) of the TDD duplexers 334a or 334b.

Although not shown, the wireless communication configuration 300 can include an off-module low noise amplifier apart from the HB front-end module 301a and from the LB front-end module 301b. The off-module low noise amplifier is configured to amplify signals received from the HB front-end module (e.g., RX1) and/or to amplify signals received from the LB front-end module (e.g., RX2).

The wireless communication configuration 300 can be configured to perform downlink carrier aggregation where the HB front-end module 301a is configured to process high-band cellular signals for transmission and to process high-band cellular signals directed to the HB front-end module from the multiplexer 304. The wireless communication configuration 300 is further configured to perform downlink carrier aggregation where the LB front-end module 301b is configured to process low-band cellular signals directed to the LB front-end module 301b from the multiplexer 304.

The wireless communication configuration 300 can be configured to perform uplink carrier aggregation where the HB front-end module 301a is configured to process high-band cellular signals for transmission and to process high-band cellular signals directed to the HB front-end module from the multiplexer. The wireless communication configuration 300 is further configured to perform uplink carrier aggregation where the LB front-end module 301b is configured to process low-band cellular signals for transmission and to process low-band cellular signals directed to the LB front-end module from the multiplexer 304.

Although not shown, it is to be understood that the wireless communication configuration 300 can further include a third front-end module (e.g., a ultrahigh-band front-end module or a mid-band front-end module) coupled to a bandpass filter of the multiplexer 304. It is also to be understood that the HB front-end module 301a can be implemented on a first packaging substrate and the LB front-end module 301b can be implemented on a second, separate packaging substrate.

Tables 1A and 1B illustrate cellular frequency bands with downlink CA pairs. Tables 1A and 1B illustrate some of the challenges associated with DL CA. In particular, certain frequency band pairings present technological challenges when combining the bands for DL CA. Similar considerations can be made for uplink CA. In the tables, the DL CA pairings are ordered (left to right in Table 1A then left to right in Table 1B) in order of priority.

TABLE 1A

| | Band | Mode | Uplink (MHz) | Downlink (MHz) | DL CA Pairs (by priority) | | | | |
|---|---|---|---|---|---|---|---|---|---|
| LB | B12 | FDD | 699-716 | 729-746 | | | | | |
| | B17 | FDD | 704-716 | 734-746 | X | X | | | |
| | B13 | FDD | 777-787 | 746-756 | | | X | | |
| | B14 | FDD | 788-798 | 758-768 | | | | | |
| | B20 | FDD | 832-862 | 791-821 | | | | | |
| | B26 | FDD | 814-849 | 859-894 | | X | | | |
| | B18 | FDD | 815-830 | 860-875 | | | | X | |
| | B5 | FDD | 824-849 | 869-894 | X | | | X | X |
| | B5' | FDD | 825-830 | 870-875 | | | | | |
| | B6 | FDD | 830-840 | 875-885 | | | | X | |
| | B19 | FDD | 830-845 | 875-890 | | | | | |
| | B8 | FDD | 880-915 | 925-960 | | | | | |
| MB | B11 | FDD | 1427.9-1447.9 | 1475.9-1495.9 | | | | | |
| | B21 | FDD | 1447.9-1462.9 | 1495.9-1510.9 | | | | | |
| | B24 | FDD | 1626.5-1660.5 | 1525-1559 | | | | | |
| | B3 | FDD | 1710-1785 | 1805-1880 | | | | | X |
| | B9 | FDD | 1749.9-1784.9 | 1844.9-1879.9 | | | | | |
| | B35 | TDD | | 1850-1910 | | | | | |
| | B3' | FDD | 1770-1780 | 1860-1870 | | | | | |
| | B39 | TDD | | 1880-1920 | | | | | |
| | B33 | TDD | | 1900-1920 | | | | | |
| | B37 | TDD | | 1910-1930 | | | | | |
| | B2 | FDD | 1850-1910 | 1930-1990 | X | | | | |
| | B25 | FDD | 1850-1915 | 1930-1995 | | X | | | |
| | B36 | TDD | | 1930-1990 | | | | | |
| | B34 | TDD | | 2010-2025 | | | | | |
| | B4 | FDD | 1710-1755 | 2110-2155 | X | X | X | | |
| | B10 | FDD | 1710-1770 | 2110-2170 | | | | | |
| | B1 | FDD | 1920-1980 | 2110-2170 | | | | X | |
| | B1' | FDD | 1920-1940 | 2110-2130 | | | | | |
| HB | B40 | TDD | | 2300-2400 | | | | | |
| | B41 | TDD | | 2496-2690 | | | | | |
| | B38 | TDD | | 2570-2620 | | | | | |
| | B7 | FDD | 2500-2570 | 2620-2690 | | | | | |
| | B42 | TDD | | 3400-3600 | | | | | |
| | B22 | FDD | 3410-3490 | 3510-3590 | | | | | |
| | B43 | TDD | | 3600-3800 | | | | | |

TABLE 1B

|  | Band | Mode | Uplink (MHz) | Downlink (MHz) | DL CA Pairs (by priority) | | | |
|---|---|---|---|---|---|---|---|---|
| LB | B12 | FDD | 699-716 | 729-746 | X | | | |
|  | B17 | FDD | 704-716 | 734-746 | X | | | |
|  | B13 | FDD | 777-787 | 746-756 | | | | |
|  | B14 | FDD | 788-798 | 758-768 | | | | |
|  | B20 | FDD | 832-862 | 791-821 | X | | X | X |
|  | B26 | FDD | 814-849 | 859-894 | | | | |
|  | B18 | FDD | 815-830 | 860-875 | | | | |
|  | B5 | FDD | 824-849 | 869-894 | | | | |
|  | B5' | FDD | 825-830 | 870-875 | | | | |
|  | B6 | FDD | 830-840 | 875-885 | | | | |
|  | B19 | FDD | 830-845 | 875-890 | | | | |
|  | B8 | FDD | 880-915 | 925-960 | X | | | |
| MB | B11 | FDD | 1427.9-1447.9 | 1475.9-1495.9 | | | | |
|  | B21 | FDD | 1447.9-1462.9 | 1495.9-1510.9 | | | | |
|  | B24 | FDD | 1626.5-1660.5 | 1525-1559 | | | | |
|  | B3 | FDD | 1710-1785 | 1805-1880 | X | X | | X |
|  | B9 | FDD | 1749.9-1784.9 | 1844.9-1879.9 | | | | |
|  | B35 | TDD | | 1850-1910 | | | | |
|  | B3' | FDD | 1770-1780 | 1860-1870 | | | | |
|  | B39 | TDD | | 1880-1920 | | | | |
|  | B33 | TDD | | 1900-1920 | | | | |
|  | B37 | TDD | | 1910-1930 | | | | |
|  | B2 | FDD | 1850-1910 | 1930-1990 | | X | X | |
|  | B25 | FDD | 1850-1915 | 1930-1995 | | | | |
|  | B36 | TDD | | 1930-1990 | | | | |
|  | B34 | TDD | | 2010-2025 | | | | |
|  | B4 | FDD | 1710-1755 | 2110-2155 | | X | | |
|  | B10 | FDD | 1710-1770 | 2110-2170 | | | | |
|  | B1 | FDD | 1920-1980 | 2110-2170 | | | | |
|  | B1' | FDD | 1920-1940 | 2110-2130 | | | | |
| HB | B40 | TDD | | 2300-2400 | | | | |
|  | B41 | TDD | | 2496-2690 | | | | |
|  | B38 | TDD | | 2570-2620 | | | | |
|  | B7 | FDD | 2500-2570 | 2620-2690 | | | X | |
|  | B42 | TDD | | 3400-3600 | | | | |
|  | B22 | FDD | 3410-3490 | 3510-3590 | | | | |
|  | B43 | TDD | | 3600-3800 | | | | |

Figure 4:
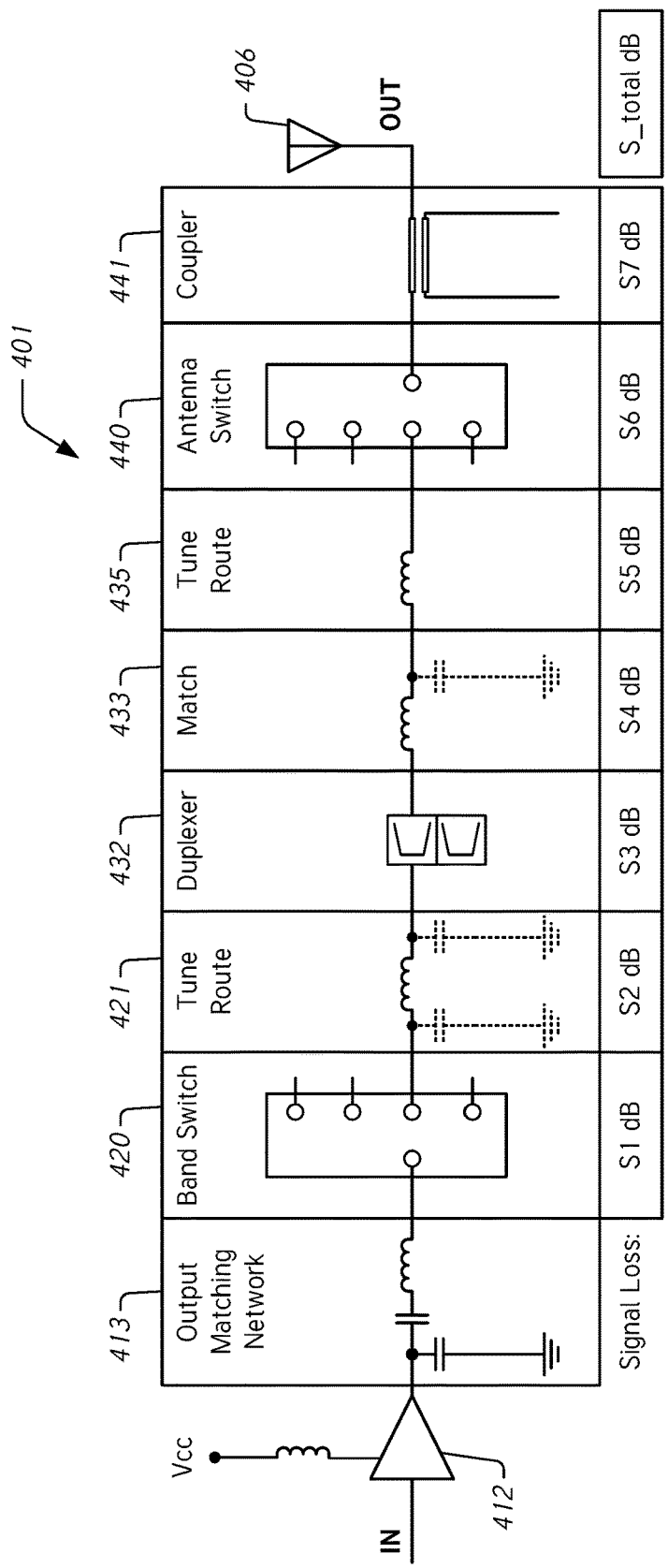
FIG. 4 illustrates a schematic representation of an amplification path in a front-end module to demonstrate considerations regarding signal loss and a power budget in the amplification path.

FIG. 4 illustrates a schematic representation of an amplification path in a front-end module 401 to demonstrate considerations regarding signal loss and a power budget in the amplification path. The amplification path includes a power amplifier 412 that is powered by a supply voltage (Vcc). The amplification path further includes an output matching network 413 that can be coupled to a reference potential node through a capacitor. The output matching network 413 including a capacitor and an inductor in series. The amplification path can further include a band switch 420 (e.g., a multiplexer as described herein) implemented as a single pole multiple throw switch. The amplification path can further include a tune route 421 that includes an inductor and optional paths to reference potential nodes through capacitors to provide route tuning. The amplification path can include a duplexer 432 as described herein. The amplification path can include matching components 433 to match impedance of the duplexer 443, the matching components including an inductor that is optionally coupled to a reference potential node through a capacitor. The amplification path includes another tune route 435 similar to the tune route 421 described herein. The amplification path includes an antenna switch 440 (e.g., an ASM as described herein) implemented as a single pole multiple throw switch. The amplification path includes a coupler 441 prior to being output to an antenna 406 for transmission.

Each component in the amplification path can contribute to signal loss. For example, the band switch 420 can contribute S1 dB of signal loss, the tune route 421 can contribute S2 dB of signal loss, the duplexer 432 can contribute S3 dB of signal loss, the matching components 433 can contribute S4 dB of signal loss, the tune route 435 can contribute S5 dB of signal loss, the antenna switch 440 can contribute S6 dB of signal loss, and the coupler 441 can contribute S7 dB of signal loss. The total loss (S_total) is then a sum of the losses of the individual components. By way of example, S1 can be about 0.3 dB, S2 can be about 0.25 dB, S3 can be about 1.4 dB, S4 can be about 0.15 dB, S5 can be about 0.1 dB, S6 can be about 0.6 dB, and S7 can be about 0.2 dB for a total loss (S_total) of about 3 dB. It is advantageous to reduce the signal losses introduced by the individual components.

Example Wireless Devices

In some implementations, an architecture, a device and/or a circuit having one or more features described herein can be included in an RF device such as a wireless device. Such an architecture, a device and/or a circuit can be implemented directly in the wireless device, in one or more modular forms as described herein, or in some combination thereof. In some embodiments, such a wireless device can include, for example, a cellular phone, a smart-phone, a hand-held wireless device with or without phone functionality, a wireless tablet, a wireless router, a wireless access point, a wireless base station, etc.

Figure 5:
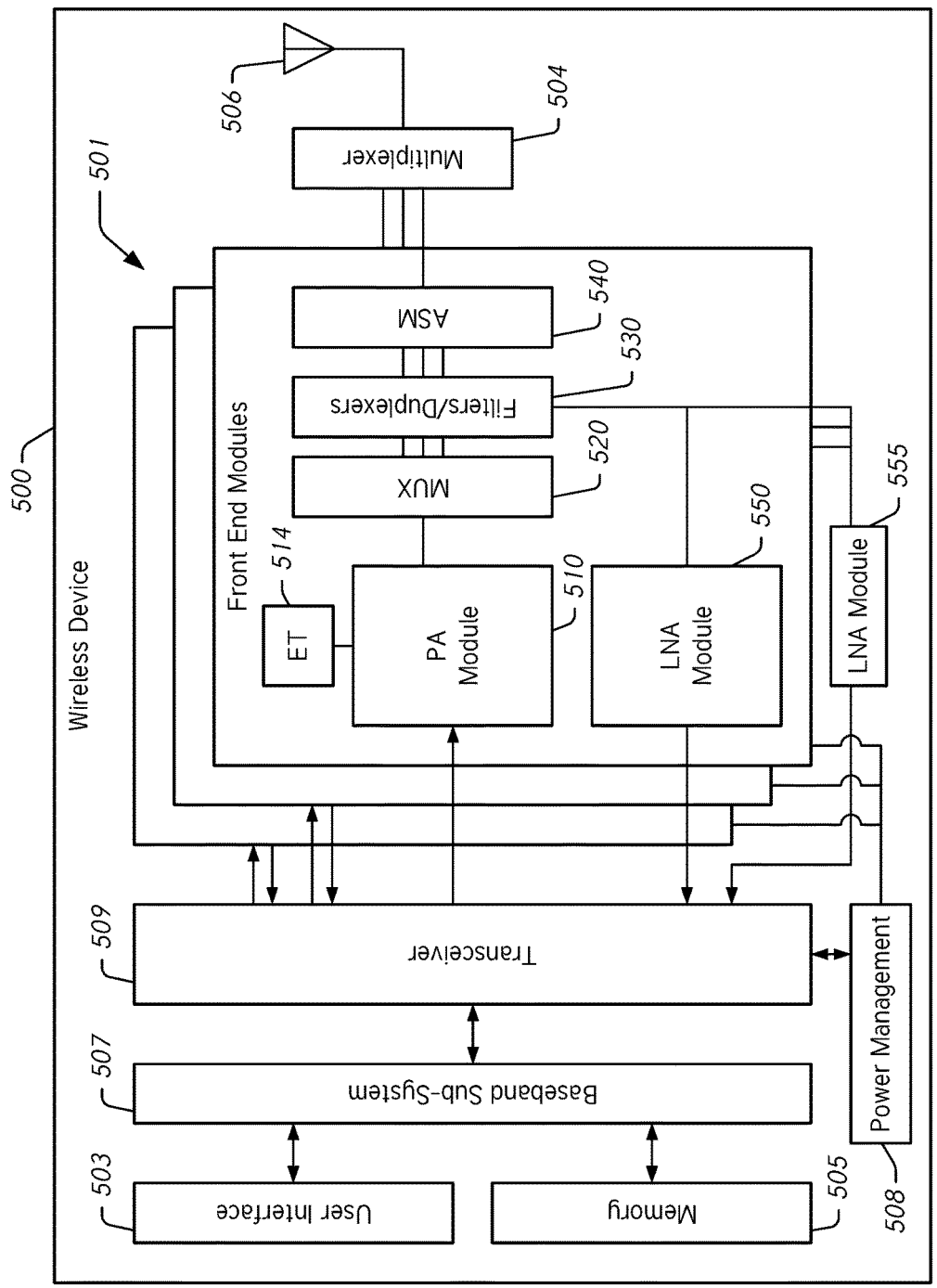
FIG. 5 illustrates an example wireless device having one or more advantageous features described herein.

FIG. 5 illustrates an example wireless device 500 having one or more advantageous features described herein. In some embodiments, such advantageous features can be implemented in one or more front-end (FE) modules generally indicated as 501. As described herein, such front-end modules 501 can include an antenna switch module (ASM) 540, filters and duplexers 530, a multiplexer 520, a power amplifier (PA) module 510, envelope tracking (ET) 514, low noise amplifier (LNA) module 550. In some embodiments, the envelope tracking 514 can be implemented as part of the PA module 510.

The PA module 510 includes a plurality of PAs that receive their respective RF signals from a transceiver 509 that can be configured and operated to generate RF signals to be amplified and transmitted, and to process received signals. The transceiver 509 interacts with a baseband sub-system 507 that is configured to provide conversion between data and/or voice signals suitable for a user and RF signals suitable for the transceiver 509. The transceiver 509 is connected to a power management component 508 (e.g., a power management integrated circuit or PMIC) that is configured to manage power for the operation of the wireless device 500. Such power management 508 can control operations of the baseband sub-system 507 and the front-end modules 501.

The baseband sub-system 507 is connected to a user interface 503 to facilitate various input and output of voice and/or data provided to and received from the user. The baseband sub-system 507 can also be connected to a memory 505 that is configured to store data and/or instructions to facilitate the operation of the wireless device, and/or to provide storage of information for the user.

In the example wireless device 500, the front-end modules 510 are coupled to an antenna 506 through a multiplexer 504. As described herein, the multiplexer 504 is configured to direct signals within particular cellular frequency bands to targeted front-end modules that are configured to handle signals within the corresponding frequency bands. For example, the wireless device 500 can include a low-band front-end module configured to handle low band cellular signals, a mid-band front-end module configured to handle mid-band cellular signals, and a high-band front-end module configured to handle high-band cellular signals. In some embodiments, the wireless device 500 includes a front-end module configured to handle mid- and high-band signals together.

Signals to be transmitted can be routed from the transceiver 509 to the PA module 510 on the appropriate front-end module 501 where the signals are amplified (or amplification is bypassed, as described herein). The signals are then routed through the multiplexer 520, filters and/or duplexers 530, and the ASM 540 before being passed to the antenna 506 for transmission. Similarly, received signals are routed from the antenna 506 through the multiplexer 504 and directed to a front-end module 501 corresponding to a particular cellular frequency band range. The signals are routed and filtered using the ASM 540 and the filters/duplexers 530 before being amplified by the LNA module 550. One or more of the front-end modules 501 can be configured to route an FDD cellular frequency band to an LNA module 555 that is separate from the front-end modules 501. Amplified received signals from the LNA module 550 and/or the LNA module 555 can then be routed to the transceiver 509.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

One or more features of the present disclosure can be implemented with various cellular frequency bands as described herein. Examples of such bands are listed in Table 2. It will be understood that at least some of the bands can be divided into sub-bands. It will also be understood that one or more features of the present disclosure can be implemented with frequency ranges that do not have designations such as the examples of Table 2.

TABLE 2

| Band | Mode | Tx Frequency Range (MHz) | Rx Frequency Range (MHz) |
| --- | --- | --- | --- |
| B1 | FDD | 1,920-1,980 | 2,110-2,170 |
| B2 | FDD | 1,850-1,910 | 1,930-1,990 |
| B3 | FDD | 1,710-1,785 | 1,805-1,880 |
| B4 | FDD | 1,710-1,755 | 2,110-2,155 |
| B5 | FDD | 824-849 | 869-894 |
| B6 | FDD | 830-840 | 875-885 |
| B7 | FDD | 2,500-2,570 | 2,620-2,690 |
| B8 | FDD | 880-915 | 925-960 |
| B9 | FDD | 1,749.9-1,784.9 | 1,844.9-1,879.9 |
| B10 | FDD | 1,710-1,770 | 2,110-2,170 |
| B11 | FDD | 1,427.9-1,447.9 | 1,475.9-1,495.9 |
| B12 | FDD | 699-716 | 729-746 |
| B13 | FDD | 777-787 | 746-756 |
| B14 | FDD | 788-798 | 758-768 |
| B15 | FDD | 1,900-1,920 | 2,600-2,620 |
| B16 | FDD | 2,010-2,025 | 2,585-2,600 |
| B17 | FDD | 704-716 | 734-746 |
| B18 | FDD | 815-830 | 860-875 |
| B19 | FDD | 830-845 | 875-890 |
| B20 | FDD | 832-862 | 791-821 |
| B21 | FDD | 1,447.9-1,462.9 | 1,495.9-1,510.9 |
| B22 | FDD | 3,410-3,490 | 3,510-3,590 |
| B23 | FDD | 2,000-2,020 | 2,180-2,200 |
| B24 | FDD | 1,626.5-1,660.5 | 1,525-1,559 |
| B25 | FDD | 1,850-1,915 | 1,930-1,995 |
| B26 | FDD | 814-849 | 859-894 |
| B27 | FDD | 807-824 | 852-869 |
| B28 | FDD | 703-748 | 758-803 |
| B29 | FDD | N/A | 716-728 |
| B30 | FDD | 2,305-2,315 | 2,350-2,360 |
| B31 | FDD | 452.5-457.5 | 462.5-467.5 |
| B32 | FDD | N/A | 1,452-1,496 |
| B33 | TDD | 1,900-1,920 | 1,900-1,920 |
| B34 | TDD | 2,010-2,025 | 2,010-2,025 |
| B35 | TDD | 1,850-1,910 | 1,850-1,910 |
| B36 | TDD | 1,930-1,990 | 1,930-1,990 |
| B37 | TDD | 1,910-1,930 | 1,910-1,930 |
| B38 | TDD | 2,570-2,620 | 2,570-2,620 |
| B39 | TDD | 1,880-1,920 | 1,880-1,920 |
| B40 | TDD | 2,300-2,400 | 2,300-2,400 |
| B41 | TDD | 2,496-2,690 | 2,496-2,690 |
| B42 | TDD | 3,400-3,600 | 3,400-3,600 |
| B43 | TDD | 3,600-3,800 | 3,600-3,800 |
| B44 | TDD | 703-803 | 703-803 |
| B45 | TDD | 1,447-1,467 | 1,447-1,467 |
| B46 | TDD | 5,150-5,925 | 5,150-5,925 |
| B65 | FDD | 1,920-2,010 | 2,110-2,200 |
| B66 | FDD | 1,710-1,780 | 2,110-2,200 |
| B67 | FDD | N/A | 738-758 |
| B68 | FDD | 698-728 | 753-783 |

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A front-end module configured to support carrier aggregation, the front-end module comprising:
   a power amplifier module including one or more power amplifiers configured to amplify signals received at a transceiver port;
   an envelope tracker coupled to the power amplifier module and configured to modify a supply voltage to the power amplifier module to increase efficiency of the one or more power amplifiers;
   a multiplexer coupled to the power amplifier module, the multiplexer configured to direct received signals along a plurality of paths;
   a first duplexer coupled to the multiplexer, the first duplexer configured to process signals that utilize a frequency division duplex scheme;
   a second duplexer coupled to the multiplexer, the second duplexer configured to process signals that utilize a time division duplex scheme;
   an antenna switch module coupled to the first duplexer and to the second duplexer, the antenna switch module configured to direct signals between an antenna port and the first duplexer or the second duplexer; and
   a low noise amplifier module including one or more low noise amplifiers configured to amplify signals received at the antenna port, the low noise amplifier module coupled to the second duplexer to amplify signals that utilize the time division duplex scheme.

2. The front-end module of claim 1 wherein the envelope tracker is implemented as part of the power amplifier module.

3. The front-end module of claim 1 further comprising a bypass switch that provides a bypass path from the transceiver port to the multiplexer to bypass the one or more power amplifiers of the power amplifier module.

4. The front-end module of claim 1 wherein the first duplexer is configured to direct signals received at the antenna port to a FDD output port that is different from the transceiver port.

5. The front-end module of claim 1 wherein the first duplexer is configured to receive signals in the cellular frequency band B7 and the second duplexer is configured to receive signals in the cellular frequency band B41.

6. The front-end module of claim 5 further comprising a third duplexer configured to receive signals in the cellular frequency band B38.

7. The front-end module of claim 6 further comprising a fourth duplexer configured to receive signals in the cellular frequency band B40.

8. The front-end module of claim 7 further comprising a first TDD switch configured to receive signals from the second duplexer and the third duplexer and to direct selected signals to a first low noise amplifier of the low noise amplifier module.

9. The front-end module of claim 8 further comprising a second TDD switch configured to receive signals from the fourth duplexer and to selectively direct the received signals to a second low noise amplifier of the low noise amplifier module.

10. The front-end module of claim 1 further comprising a notch filter coupled to the second duplexer, the notch filter configured to extract signals that correspond to a wireless local area network signal.

11. The front-end module of claim 1 wherein the antenna switch module includes a single pole, multiple throw (SPMT) switch wherein the pole is coupled to the antenna port and a first throw is coupled to a first filter of the first duplexer, a second throw is coupled to a second filter of the first duplexer, and a third throw is coupled to the second duplexer.

12. The front-end module of claim 1 wherein the front-end module is implemented on a packaging substrate configured to receive a plurality of components.

13. A wireless communication configuration configured to support carrier aggregation, the wireless communication configuration comprising:
   an antenna configured to receive wireless signals within a plurality of cellular frequency bands;
   a multiplexer coupled to the antenna, the multiplexer including a first filter configured to pass signals within a first frequency range and a second filter configured to pass signals within a second frequency range different from the first frequency range;
   a first front-end module coupled to the first filter; and
   a second front-end module coupled to the second filter, each of the first front-end module and the second front-end module including a power amplifier module including one or more power amplifiers configured to amplify signals received at a transceiver port, each of the first front-end module and the second front-end module also including an envelope tracker coupled to the power amplifier module and configured to modify a supply voltage to the power amplifier module to increase efficiency of the one or more power amplifiers, each of the first front-end module and the second front-end module also including a multiplexer coupled to the power amplifier module, the multiplexer configured to direct received signals along a plurality of paths, each of the first front-end module and the second front-end module also including a first duplexer coupled to the multiplexer, the first duplexer configured to process signals using a frequency division duplex scheme, each of the first front-end module and the second front-end module also including a second duplexer coupled to the multiplexer, the second duplexer configured to process signals using a time division duplex scheme, each of the first front-end module and the second front-end module also including an antenna switch module coupled to the first duplexer and to the second duplexer, the antenna switch module configured to direct signals between an antenna port and the first duplexer or the second duplexer, and each of the first front-end module and the second front-end module also including a low noise amplifier module including one or more low noise amplifiers configured to amplify signals received at the antenna port, the low noise amplifier module coupled to the second duplexer to amplify signals using the time division duplex scheme.

14. The wireless communication configuration of claim 13 further comprising an off-module low noise amplifier apart from the first front-end module and from the second front-end module, the off-module low noise amplifier configured to amplify signals received from the first front-end module.

15. The wireless communication configuration of claim 13 wherein, to perform downlink carrier aggregation:
the first front-end module is configured to process signals for transmission and to process high-band cellular signals directed to the first front-end module from the first filter; and
the second front-end module is configured to process low-band cellular signals directed to the second front-end module from the second filter.

16. The wireless communication configuration of claim 13 wherein, to perform uplink carrier aggregation:
the first front-end module is configured to process high-band cellular signals for transmission and to process high-band cellular signals directed to the first front-end module from the first filter; and
the second front-end module is configured to process low-band cellular signals for transmission and to process low-band cellular signals directed to the second front-end module from the second filter.

17. The wireless communication configuration of claim 13 wherein the multiplexer comprises a diplexer configured to separate low-band and high-band cellular signals.

18. The wireless communication configuration of claim 13 wherein the multiplexer comprises a triplexer configured to separate low-band, mid-band, and high-band cellular signals.

19. The wireless communication configuration of claim 18 further comprising a third front-end module coupled to a bandpass filter of the triplexer.

20. The wireless communication configuration of claim 13 wherein the first front-end module is implemented on a first packaging substrate and the second front-end module is implemented on a second packaging substrate.

* * * * *